Figure 1:
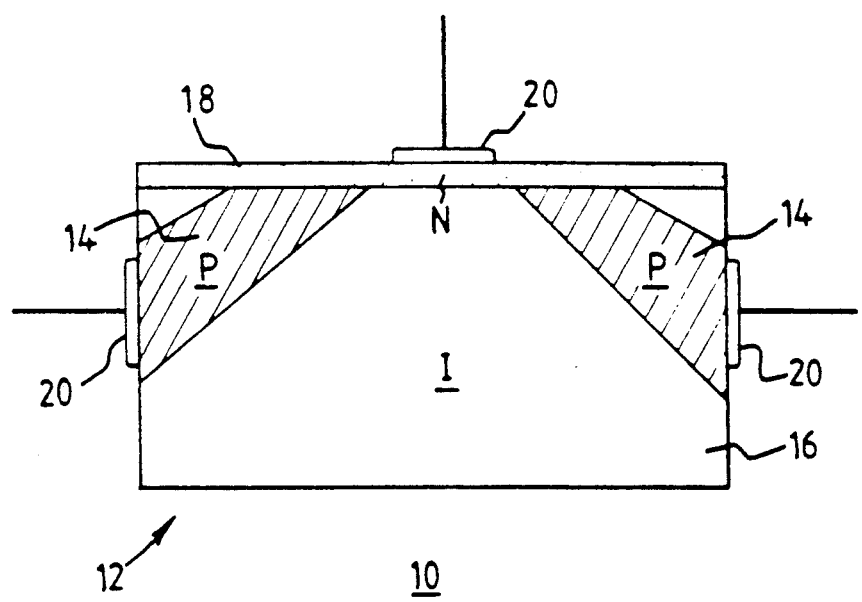

United States Patent [19]

Welbourn

[11] Patent Number: 5,177,585
[45] Date of Patent: Jan. 5, 1993

[54] P-N-P DIAMOND TRANSISTOR

[75] Inventor: Christopher M. Welbourn, Maidenhead, England

[73] Assignee: Gersan Establishment, Vaduz, Liechtenstein

[21] Appl. No.: 721,558

[22] PCT Filed: Feb. 1, 1990

[86] PCT No.: PCT/GB90/00143
§ 371 Date: Sep. 23, 1991
§ 102(e) Date: Sep. 23, 1991

[87] PCT Pub. No.: WO90/09033
PCT Pub. Date: Aug. 9, 1990

[30] Foreign Application Priority Data

Feb. 1, 1989 [GB] United Kingdom ............... 8902135
May 30, 1989 [GB] United Kingdom ............... 8912354

[51] Int. Cl.5 ........................................... H01L 29/72
[52] U.S. Cl. .................................. 257/565; 257/575; 257/613
[58] Field of Search ..................... 357/34; 437/15

[56] References Cited

U.S. PATENT DOCUMENTS

| 4,571,447 | 2/1986 | Prins | 357/30 X |
| 4,863,529 | 9/1989 | Imai et al. | 437/100 |
| 4,982,243 | 1/1991 | Nakahata et al. | 357/15 |
| 5,002,899 | 3/1991 | Geis et al. | 357/15 |
| 5,006,914 | 4/1991 | Beetz, Jr. | 357/15 |
| 5,030,583 | 7/1991 | Beetz et al. | 437/100 |
| 5,051,785 | 9/1991 | Beetz, Jr. et al. | 357/34 |
| 5,072,264 | 12/1991 | Jones | 357/16 |

Primary Examiner—Eugene R. LaRoche
Assistant Examiner—R. Ratliff
Attorney, Agent, or Firm—Kerkam, Stowell, Kondracki & Clarke

[57] ABSTRACT

The present invention provides a P-N-P diamond transistor and a method of manufacture thereof. The transistor comprises a diamond substrate having two p-type semiconducting regions separated by an insulating region with an n-type semi-conducting layer established by chemical vapour deposition. Preferably the p-type regions are obtained by doping with boron and controlling the concentration of nitrogen impurities by the use of nitrogen getters. The n-type layer preferably contains phosphorus.

12 Claims, 1 Drawing Sheet

P-N-P DIAMOND TRANSISTOR

The present invention relates to a P-N-P diamond transistor and a method of manufacture thereof.

It is known that although most synthetic diamonds contain impurities such as nitrogen, such impurities do not result in semiconduction at normal temperatures and pressures. Formation of semiconducting diamond materials has been achieved by doping with boron at extremely high pressures. There has not, however, been any known proposal to form a P-N-P diamond transistor of simple construction and relatively straightforward manufacture. The present invention seeks to provide a transistor and a method of manufacture thereof which can meet these requirements.

According to a first aspect of the present invention there is provided a method of manufacturing a transistor comprising the steps of: providing a diamond substrate, doping two separate regions of the substrate with a p-type impurity to produce respective semiconducting regions, and using chemical vapour deposition to provide an n-type layer of semiconducting diamond, whereby a P-N-P transistor structure is obtained.

According to a second aspect of the present invention there is provided a transitor comprising: a diamond substrate having two p-type semiconducting regions, and an n-type semiconducting layer established by chemical vapour deposition, whereby a P-N-P structure is formed.

Beneficially the p-type regions contain boron.

Advantageously the n-type layer contains phosphorus.

Preferably, nitrogen getters are introduced in the reaction mass to control the nitrogen donor content of the substrate which in turn affects the number of uncompensated boron acceptors.

An embodiment of the present invention will now be described by way of example only and with reference to the accompanying drawing which is a diagrammatic illustration of a section through a transistor manufactured in accordance with the present invention.

As illustrated in the drawing, the transistor 10 comprises a diamond substrate 12 having two p-type semiconducting regions 14 separated by an insulating region 16. An n-type semiconducting layer 18 is established by chemical vapour deposition so as to contact the p-type regions 14 and form a P-N-P structure. Respective electrical contacts 20 are bonded to the p-type regions 14 and the n-type layer 18. Thus, a P-N-P diamond transistor is achieved.

Most synthetic diamonds contain nitrogen as impurities in the form of isolated nitrogen atoms substituting for carbon in the diamond lattice. Each nitrogen atom has one more electron than is necessary to satisfy the covalent bonding requirements of the diamond lattice so that there is a donor energy level in the band gap between the valence band and the conducting band. The position of the donor level is too deep in energy below the conduction band to give rise to n-type electrical semiconduction at realistic temperatures so the diamond remains an electrical insulator.

In general, synthetic diamonds (both self-nucleated diamond grit and larger, seed-grown diamonds grown by the temperature-gradient technique) have a cubo-octahedral morphology, often modified by minor {110} and {113} facets. The concentration of isolated substitutional nitrogen is different in the different types of growth sector, being highest for {111} (i.e octahedral) sectors, lower for {100} (i.e. cube) sectors, lower still for {113} (i.e. trapezoidal) sectors and lowest for {110} (i.e. dodecahedral) sectors. It has been found that the total amount of nitrogen in a synthtic diamond can be controlled by the incorporation of nitrogen getters into the synthesis capsule.

Provided that the total nitrogen concentration is sufficiently low, doping the synthesis capsule with a small amount of boron will produce p-type semiconducting diamond. Boron is taken up preferentially by {111} sectors, then by {110} sectors and by a smaller amount by {100} and {113} sectors. However, the boron acceptor defects are usually compensated by nitrogen donor defects. P-type semiconduction results only from uncompensated boron defects, i.e. when the boron concentration is greater than the nitrogen concentration. It has been found that by controlling the amount of nitrogen getter and boron additive in the synthesis capsule, it is possible to grow diamonds with sectors of p-type semiconducting material between sectors of insulating material.

Although nitrogen defects do not produce n-type semiconduction at realistic temperatures, the incorporation of phosphorus atoms into diamond could lead to n-type semiconduction. In practice, attempts to produce n-type semiconducting diamond by doping a high-pressure synthesis capsule with phosphorus have been unsuccessful. This invention recognises that n-type semiconducting diamond ca be obtained using the technique of chemical vapour depositon (CVD). Phosphorus may be used as the CVD dopant.

One embodiment of the invention has been described with reference to the accompanying drawing. However, it will be readily apparent to those skilled in the art, from a review of the above description, that various modifications may be made within the scope of the invention.

I claim:

1. A method of manufacturing a transistor comprising the steps of:
   providing a diamond substrate,
   doping two separate regions of the substrate with a p-type impurity to form respective semiconducting regions, and
   using chemical vapour deposition to provide an n-type layer of semiconducting diamond, whereby a P-N-P transistor structure is obtained.

2. A method as claimed in claim 1, wherein said n-type layer contains phosphorus.

3. A method as claimed in claim 1, wherein said p-type impurity is boron.

4. A method as claimed in claim 1, further including the step of introducing nitrogen getters to control the nitrogen donor content of the substrate so as to control the number of uncompensated boron acceptors.

5. A method as claimed in claim 4, wherein said step of introducing nitrogen getters includes controlling the nitrogen donor content of the substrate such that the p-type semiconductor regions are separated by an insulating region.

6. A transistor comprising: a diamond substrate having two p-type semiconducting regions, and an n-type semiconducting layer established by chemical vapour deposition, whereby a P-N-P structure is formed.

7. A transistor as claimed in claim 6, wherein the n-type layer contains phosphorus.

8. A transistor as claimed in claim 6. wherein the p-type regions contain boron.

9. A transistor as claimed in claim 6. wherein the number of uncompensated boron acceptors in the substrate has been reduced by control of the nitrogen donor content of the substrate.

10. A transistor as claimed in claim 9. wherein the number of uncompensated boron acceptors in the substrate is such that the p-type semiconducting regions are separated by an insulating region.

11. A method as claimed in claim 2. wherein said p-type impurity is boron.

12. A transistor as claimed in claim 7. wherein the p-type regions contain boron.

* * * * *